United States Patent [19]
Bae

[11] Patent Number: 5,536,534
[45] Date of Patent: Jul. 16, 1996

[54] METHOD AND APPARATUS FOR COATING PHOTORESIST

[75] Inventor: Sang M. Bae, Kyoungki-do, Rep. of Korea

[73] Assignee: Hyundai Electronics Industries Co. Ltd., Kyoungki-do, Rep. of Korea

[21] Appl. No.: 408,393

[22] Filed: Mar. 22, 1995

[30] Foreign Application Priority Data

Mar. 25, 1994 [KR] Rep. of Korea .................. 94-6029

[51] Int. Cl.$^6$ .................. B05D 3/02; B05C 13/02
[52] U.S. Cl. .................. 427/375; 427/384; 118/56; 118/500
[58] Field of Search .................. 427/384, 569, 427/270, 271, 258, 377, 375; 430/327, 330; 118/56, 500

*Primary Examiner*—Shrive Beck
*Assistant Examiner*—Fred J. Parker
*Attorney, Agent, or Firm*—Nath & Associates; Gary M. Nath

[57] ABSTRACT

A method and apparatus are disclosed for coating uniformly thick photoresist upon the surface of a semiconductor having an uneven topography.

The uniform thickness of photoresist on a wafer provided with a variety of patterns can be achieved by use of the apparatus of the present invention. In this regard, a wafer of which the upper surface is primarily coated with photoresist is mounted in the wafer cassette 6 so that the upper surface faces downward and the heater 7 raises the temperature of the chamber 4 to an extent that the primarily coated photoresist may flow while the pressure is kept twice or three times larger than atmosphere by the pressure control terminal 5 under a gaseous atmosphere. Under the influence of gravity, the photoresist is distributed and flows from the surface of the wafer to the patterns since the wafer is upset. The resultant photoresist has a surface which is reshaped along with the topology thereunder and thus, has almost uniform thickness everywhere. With this improved coating uniformity of photoresist, there can be brought about a high yield, fine patterns useful for high integrated circuits, and prevention of bulk effect.

5 Claims, 2 Drawing Sheets

METHOD AND APPARATUS FOR COATING PHOTORESIST

BACKGROUND OF THE INVENTION

1. Field of the Invention

The present invention telales, in general, to lithography useful for fabricating semiconductor devices and, more particularly, to a method for the coating of photoresist, capable of allowing the photoresist to be uniformly thick regardless of the topology of the patterns formed thereunder. Also, the present invention is concerned with an apparatus therefor.

2. Description of the Prior Art

Photoresist, typically used as a photomask, if coated on, for example, a wafer by a spin coat process, has a smooth surface irrespective of the topology of the wafer, that is, patterns formed on the wafer. Thus, the resulting photoresist is different in its thickness in accordance with the position of the patterns.

In order to better understand the background of the invention, reference is made to FIG. 1 wherein photoresist coated on a wafer by a prior art technique is shown. The photoresis 3 is spin-coated on a wafer 1 which has been provided with a variety of patterns 2, showing a smooth surface. As seen in this figure, the thickness $t_1$ of the photoresist 3 from the surface to the patterns is different from that of $t_3$ from the surface to the wafer 1. As the topology of the patterns is more uneven, the difference between the thicknesses $t_1$ and $t_2$ becomes larger.

Due to the different thicknesses in the photoresist, it is difficult to set the energy of a light illuminated thereupon. For example, if the energy of light is determined on the basis of the thickness $t_1$ from the smooth surface to the wafer 1, the photoresist 3 coated over the patterns 2 is exposed to too intensive light. This results in a narrower photoresist pattern than is predetermined after development process. On the other hand, if the energy of light is based on the thinner thickness $t_2$ from the smooth surface to the patterns 2 provided on the wafer 1, the photoresist over the wafer does not absorb enough light to form a pattern. Hence, there is a photosensitive film as the area wherein no photosensitive film must remain after the development process.

As a result, the prior technique has difficulty in forming fine patterns and thus, causes a problem that the process margin in fabricating semiconductor devices is reduced, so as to lower production yield.

SUMMARY OF THE INVENTION

Therefore, an object of the present invention is to overcome the above problems encountered in prior art and to provide a method for coating photoresist, capable of forming uniformly thick photoresist even on an extremely poor topology.

It is another object of the present invention to provide the method for coating photoresist while reducing the bulk effect, which causes critical value difference due to the energy absorption difference of light per volume of photoresist.

It is a further object of the present invention to provide the method, capable of high yield in fabricating a semiconductor devices.

It is still another object of the present invention to provide the method, useful in a semiconductor device having large scale integration.

It is an additional object of the present invention to provide an apparatus useful in performing the above method.

Based on the intensive and thorough research and study by the present inventors, the above objects can be accomplished by providing an apparatus for a semiconductor device, consisting of: a chamber; a heater provided at the side of the interior of the chamber and responsible for controlling the temperature of the chamber; a wafer cassette provided at the center of the interior of the chamber and mounting a plurality of wafers therein in such a way that the surfaces of the wafers may look downward; and a pressure control terminal responsible for maintaining the pressure of the chamber adequately, and an application of the apparatus for coating photoresist.

In accordance with another view of the present invention, there is provided a method for coating photoresist, comprising the steps of: mounting a wafer primarily coated with photoresist in a wafer cassette of a chamber in such a way that the coated surface of the wafer may look downward, said chamber being further provided with a pressure control terminal and a heater and said wafer having been provided with a variety of patterns; raising the temperature of the chamber to an extent that the photoresist may flow; and applying a high pressure into the interior of said chamber under a gas, whereby the surface of the resultant photoresist flows along the patterns and shows a uniformity in its thickness.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

The application of the preferred embodiments of the present invention is best understood with reference to the accompanying drawings.

Figure 2:
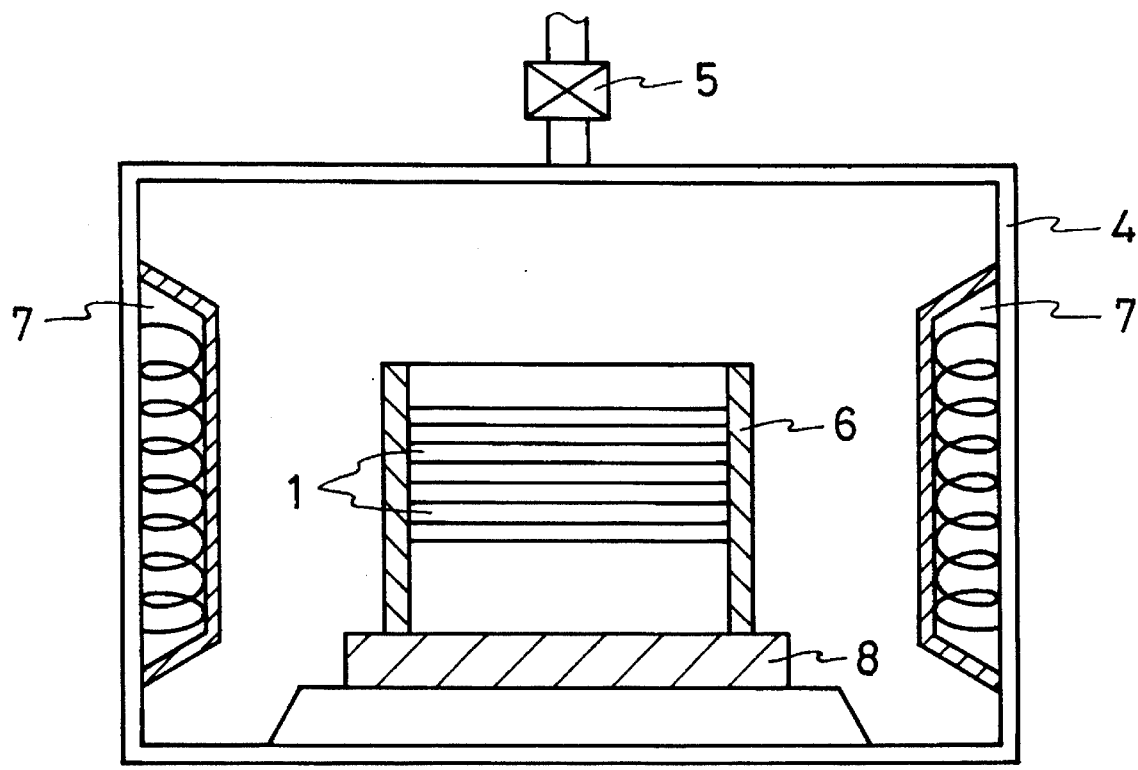
FIG. 2 is a schematic diagram showing an apparatus useful in coating photoresist in accordance with the present invention.

Referring initially to FIG. 2, there is an apparatus for coating photoresist on wafers 1, which enables the photoresist to have almost uniform thickness, in accordance with the present invention. The apparatus of the present invention consists of a chamber 4 provided with a pressure control terminal 5 and having a heater 7 at its interior side and a wafer cassette 6 fixed on a cassette supporter 8 at its center. The pressure control terminal 5 functions to control the pressure of the chamber 4, while the heater 7 is responsible for controlling the temperature of the chamber 4. After wafers 1 with a variety of patterns are primarily coated with photoresist, they are mounted in the wafer cassette 6 so that their upper surfaces, that is, the primarily coated surfaces face downward.

The uniform thickness of photoresist on an uneven wafer, for example, a wafer provided with a variety of patterns can be achieved by use of the apparatus of the present invention. In this regard, a wafer of which the upper surface is primarily coated with photoresist is mounted in the wafer cassette 6 in such a way that the upper surface may face downward, and the heater 7 works to raise the temperature of the chamber 4 to an extent that the primarily coated photoresist may flow, for example, to about 200 ° C. while the pressure is kept twice or three times larger than atmosphere by the pressure control terminal 5 under a nitrogen gas or air. In this state, the primarily coated photoresist is activated or has a high fluidity such that it may be easily affected by gravity. Under the influence of gravity, the fluid photoresist is distributed and flows from the surface of the wafer to the patterns since the wafer is upside down. The resultant photoresist has a surface which is reshaped along with the topography thereunder. Therefore, the photoresist formed by the method of the present invention has almost uniform thickness everywhere.

Figure 1:
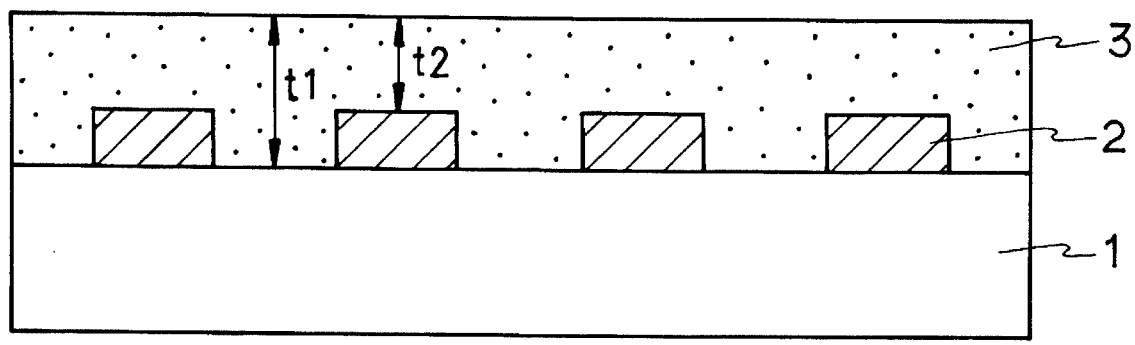
FIG. 1 is a schematic cross sectional view showing photoresist with a smooth surface, coated on an uneven topology according to conventional technique.
Figure 3:
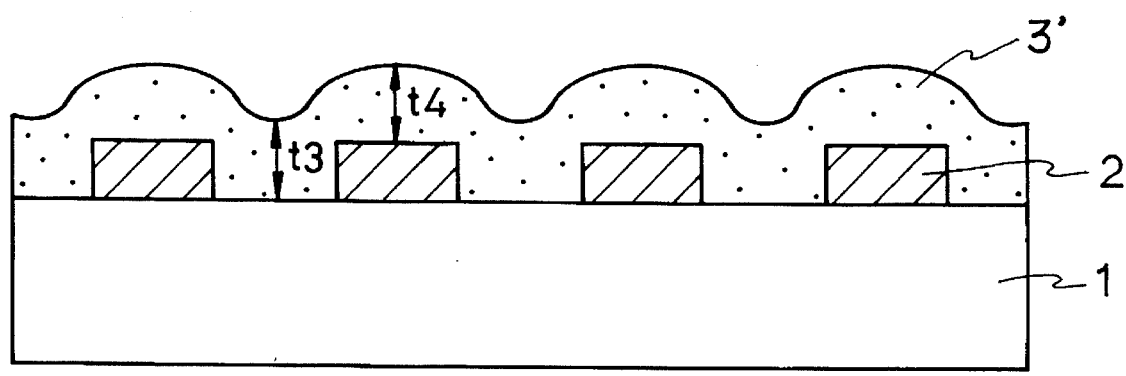
FIG. 3 is a schematic cross sectional view showing photoresist with a waved surface, coated by use of the apparatus of the invention.

Referring now to FIG. 3, there is a photoresist formed on an uneven wafer, in accordance with the present invention. As shown in this figure, a photoresist 3' formed over a wafer 1 having a variety of patterns 2 thereon exhibits a surface waving along the patterns, wherein the thickness $t_3$ from the surface of the photoresist 3' to the wafer 1 is almost the same with that of $t_4$ from the surface of the photoresist 3' to the patterns.

As described hereinbefore, uniformly thick photoresist over a topography can be accomplished by using the apparatus of the invention for coating photoresist. Accordingly, with this improved coating uniformity of photoresist, there can be secured a sufficient process margin in the fabrication of a semiconductor device. Further, the uniformity of the thickness of the photoresist allows the formation of fine patterns useful for high integrated circuits, without complicated photoresist pattern processes, such as TLR (tri level resist) in addition to reducing bulk effect, an effect that causes critical value difference attributed to the energy absorption difference of light per volume of photoresist.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for coating photoresist, by which the surface of the resultant photoresist flows over a semiconductor pattern to a uniform thickness, comprising the steps of:

mounting a wafer provided with a semiconductor pattern and having thereon a photoresist coating in a wafer cassette of a chamber in such a way that the coated surface of the wafer faces downward, said chamber provided with a pressure control terminal and a heater;

raising the temperature of the chamber by the application of thermal energy from a heat source to an extent that the photoresist will flow; and applying a pressurized gas into said chamber, such that said photoresist flows evenly over said semiconductor pattern.

2. A method in accordance with claim 1, wherein the temperature within said chamber is raised to about 200° C.

3. A method in accordance with claim 1, wherein after the pressured gas is applied, the pressure within the chamber is maintained at about two to three atmospheres.

4. A method in accordance with claim 1, wherein the gas is nitrogen or air.

5. An apparatus for coating a semiconductor wafer with photoresist of uniform thickness according to a topography of surface patterns on the semiconductor wafer, comprising:

a pressure chamber having a gas inlet and a gas outlet, said inlet adapted for the introduction of a pressurized gas into said chamber, and said outlet adapted for venting said chamber;

a heater provided at the side of the interior of the chamber and responsible for controlling the temperature of the chamber;

a wafer cassette provided at the center of the interior of the chamber and mounting a plurality of wafers therein in such a way that the photoresist coated surfaces of the wafers face downward; and a pressure control terminal responsible for maintaining a sufficient pressure within said chamber such that said photoresist flows with uniform thickness over said surface patterns.

\* \* \* \* \*

UNITED STATES PATENT AND TRADEMARK OFFICE
CERTIFICATE OF CORRECTION

PATENT NO. : 5,536,534
DATED : July 16, 1996
INVENTOR(S) : Sang Man BAE

It is certified that error appears in the above-indentified patent and that said Letters Patent is hereby corrected as shown below:

Column 4, line 24, claim 4, before "gas"

insert -- pressurized --

Signed and Sealed this

First Day of October, 1996

Attest:

BRUCE LEHMAN

*Attesting Officer*     *Commissioner of Patents and Trademarks*